United States Patent [19]
Lou et al.

[11] Patent Number: 5,928,961
[45] Date of Patent: Jul. 27, 1999

[54] DISHING INHIBITED SHALLOW TRENCH ISOLATION

[75] Inventors: Chine-Gie Lou, Hsin-Chu; Hseuh-Chung Chen, Taipei, both of Taiwan

[73] Assignee: Industrial Technology Research Institute, Hsin-Chu, Taiwan

[21] Appl. No.: 08/995,337

[22] Filed: Dec. 22, 1997

[51] Int. Cl.⁶ .................................................. H01L 21/304
[52] U.S. Cl. ........................ 438/692; 438/689; 438/691; 438/633
[58] Field of Search ................................ 438/689, 691, 438/692, 633

[56] References Cited

U.S. PATENT DOCUMENTS

| | | | |
|---|---|---|---|
| 5,292,689 | 3/1994 | Cronin et al. | 437/228 |
| 5,308,438 | 5/1994 | Cote et al. | 156/636 |
| 5,356,513 | 10/1994 | Burke et al. | 156/636 |
| 5,441,094 | 8/1995 | Pasch | 156/636.1 |
| 5,516,729 | 5/1996 | Dawson et al. | 437/228 |
| 5,540,811 | 7/1996 | Morita | 156/636.1 |
| 5,629,242 | 5/1997 | Nagashima et al. | 438/692 |

*Primary Examiner*—Benjamin Utech
*Assistant Examiner*—Kin-Chan Chen
*Attorney, Agent, or Firm*—George O. Saile; Stephen B. Ackerman

[57] ABSTRACT

A method for trench filling during integrated circuit manufacture is described in which the filled-in surface is dishing inhibited. To accomplish this an extra layer is introduced between the trench-defining mask material and the trench filler material. This transition layer is characterized by having a removal rate (under CMP) that is greater than that of both the mask material and the filler material. An important additional advantage is that end-point detection is now much easier because of the large difference in removal rates between the mask and transition layers.

15 Claims, 1 Drawing Sheet

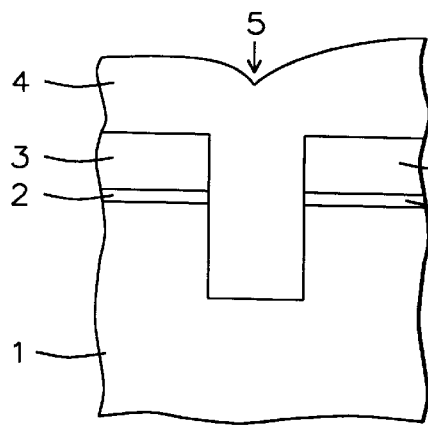
FIG. 1a – Prior Art
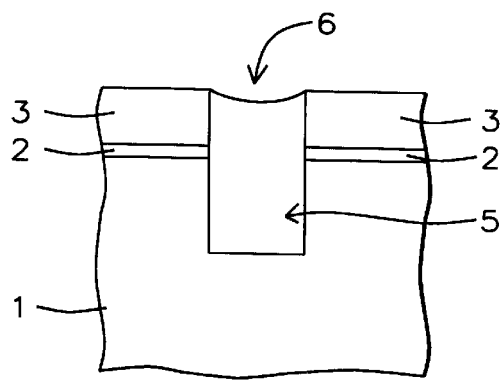
FIG. 1b – Prior Art
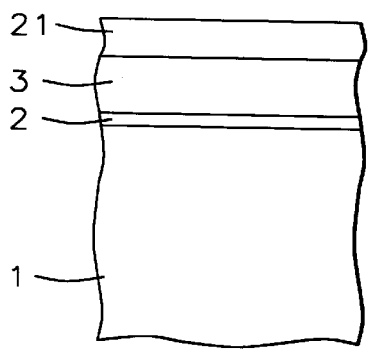
FIG. 2
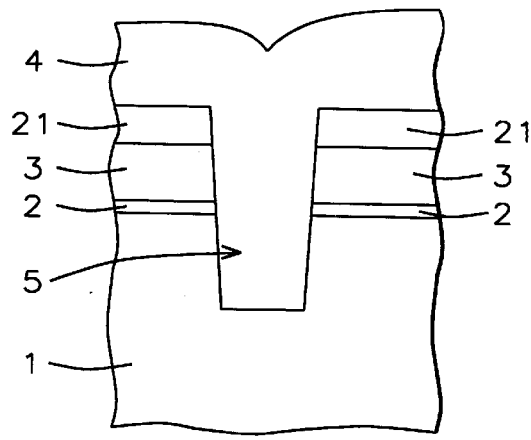
FIG. 3
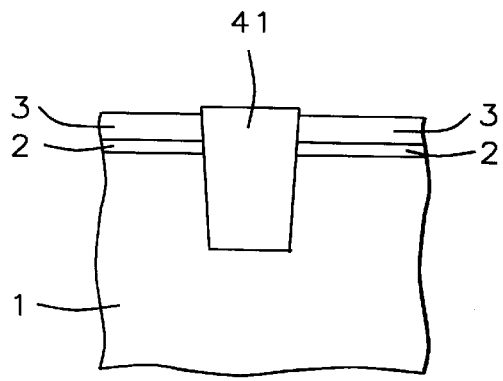
FIG. 4

DISHING INHIBITED SHALLOW TRENCH ISOLATION

BACKGROUND OF THE INVENTION

(1) Field of the Invention

The invention relates to the general field of chemical mechanical polishing (CMP) with particular reference to the problem of dishing during shallow trench isolation.

(2) Description of the Prior Art

As part of the process of manufacturing integrated circuits, it becomes necessary to electrically isolate various active devices one from another. Probably the most widely used method is Local Oxidation of Silicon (LOCOS) wherein selected regions on the semiconductor surface are oxidized to substantial depths to form regions called field oxide. As circuit densities grow ever greater, this method is limited primarily by the fact that the boundary between oxide and semiconductor tends to have a relatively gentle slope with respect to the semiconductor surface. Additionally, since the field oxide extends above the surface as well as below it, it will eventually need planarizing.

To overcome these limitations, the method of shallow trench isolation (STI) has been developed. In STI, a trench, having near vertical sides, is etched out of the semiconductor and then filled with insulating material. The excess filler material is then removed by CMP. A serious problem associated with this isolation technique is that during CMP dishing of the surface of the filled trench occurs.

To illustrate this, we refer now to FIG. 1a which is a schematic cross-section of part of a silicon substrate 1 on which thermal oxide layer 2 is covered by silicon nitride layer 3. The latter has already been patterned and etched, using standard photolithographic techniques, to serve as a mask during the etching (usually reactive ion etching) of trench 5. The latter is then over-filled with a layer of insulating material such as silicon oxide 4 deposited through chemical vapor deposition (CVD oxide).

The excess of filler material 4 is then removed by CMP. It is often the case that the removal rate (by CMP) of the filler material 4 is significantly greater than the removal rate of trench masking material 3. To meet subsequent processing requirements, it is necessary that all of layer 4 (other than that which is filling trench 5) be removed. As a result, as illustrated in FIG. 1b, the surface 6 of trench 5 develops a concave aspect called dishing because too much of layer 4 will have been removed.

Most systems provide means for detecting when, in the course of CMP, layer 3 has been reached. This is important to ensure that, while layer 4 has been fully removed, as little as possible of layer 3 gets removed. To this end a substantially different removal rate for layer 4 relative to layer 3 is desirable. In practice, this necessary difference can only be achieved by making the removal rate for layer 4 faster than that of layer 3. There are thus contradictory requirements for relative removal rates between layers 3 and 4 which make it difficult to remove only filler material, and no more, while at the same time avoiding dishing effects.

There have been a number of proposals offered in the prior art to deal with this problem. For example, Morita (U.S. Pat. No. 5,540,811 July 1996) describes a method that relies on the selective placement of areas comprising slow polishing material over convex (projecting) areas of fast polishing material for their protection. Burke et al. (U.S. Pat. No. 5,356,513 October 1994) lay down alternating hard and soft layers, the minimum configuration being hard-soft-hard or soft-hard-soft. During polishing, the initial removal of hard material is from the high spots, the soft material being thereby exposed being then rapidly etched while hard material still present over the low spots etches slowly. This leads to a general flattening of the surface. This invention is intended for use in planarizing the surfaces of via holes filled with tungsten. Since tungsten is hard, dishing is not a problem.

Dawson et al. (U.S. Pat. No. 5,516,729 May 1996) teach a method of planarizing based on modifying the hardness of their top surface through heat treatment, prior to the application of CMP. Pasch (U.S. Pat. No. 5,441,094 August 1995) is similar to Burke et al. (supra) in that a hard cap layer is also placed over the trench filler material. As polishing proceeds, the cap layer is selectively removed from the high spots so the now exposed filler material is rapidly removed, the low spots still being protected by the cap material. Cronin et al. (U.S. Pat. No. 5,292,689 March 1994) take an entirely different approach. Silicon pillars are formed inside the trenches that are to be filled and planarized. In effect, a series of sub trenches are formed within each primary trench, these sub trenches being much less susceptible to dishing problems.

SUMMARY OF THE INVENTION

It has been an object of the present invention to provide a method for effective shallow trench isolation in an integrated circuit.

Another object of the invention has been to be able to fill a trench in a substrate.

A still further object has been to achieve improved end-point detection during CMP at the same time that dishing effects are eliminated.

These objects have been achieved by adding an extra layer, between the trench-defining mask material and the trench filler material. This transition layer is characterized by having a removal rate (under CMP) that is greater than that of both the mask material and the filler material. An important additional advantage is that end-point detection is now much easier because of the large difference in removal rates between the mask and transition layers.

BRIEF DESCRIPTION OF THE DRAWINGS

FIGS. 1a and 1b illustrate the prior art method for forming and filling a trench, including the resulting dishing effect.

FIG. 2 shows the layers laid down in preparation for trench formation and filling as taught by the present invention.

FIG. 3 shows a trench formed and overfilled, prior to a planarization step.

FIG. 4 shows a filled and planarized trench with no accompanying dishing.

DESCRIPTION OF THE PREFERRED EMBODIMENTS

In its most general form the present invention teaches a method for removing material, particularly by CMP, across a boundary between two materials that have different removal rates. An example of such a boundary is the edge of a trench of the type discussed above. It is therefore appropriate to provide details concerning the practice of the invention in terms of filling and then planarizing a trench during the manufacture of a silicon integrated circuit. It should, however, be noted that other materials, some of which we will exemplify, could also be used without departing from the spirit and scope of the invention.

Referring now to FIG. 2, we show there a schematic cross-section of part of an integrated circuit in the process of being manufactured. Silicon substrate 1, including a thin surface layer of thermal oxide 2, has been coated with a layer of silicon nitride 3 to a thickness between about 0.1 and 0.2 microns. A characteristic of silicon nitride is that it is a hard material with a slower removal rate, under CMP, than most materials. It is a preferred material in this instance because it has other properties that make it suitable for use in IC manufacture, but the invention would still work effectively if similar hard materials such as boron nitride were used.

If the practices of the prior art were being followed, layer 3 would then be patterned and etched to form a mask that defined the edges of a trench. In a key departure from this practice, introduced by the present invention, a transition layer 21 is deposited on layer 3 prior to mask formation. A typical thickness for layer 21 would be between about 300 and 1,500 Angstroms.

The most important characteristic of layer 21 is the rate at which it will be removed during CMP relative to the removal rates of layer 3 and to the material that will later be used to fill the trench. Specifically, the removal rate of layer 21 must be greater than that of the filler material which, by definition, has a removal rate that is greater than that of layer 3. For the invention to work effectively, the removal rate for layer 21 should be between about 30 and 100 times the removal rate of layer 3. Examples of materials suitable for layer 21 include polysilicon, phosphosilicate glass, and borophosphosilicate glass.

Layer 21 is now patterned and etched, along with layers 3 and 2, to form a trench mask and the trench is formed by etching, most commonly by means of reactive ion etching (RIE). Said trench extends through layers 21, 3, and 2 into silicon substrate 1 for a total depth between about 0.3 and 0.5 microns. Trenches are usually rectangular in shape, having a width between about 0.25 and 20 microns. It is also advisable to slope the trench walls slightly to achieve good insulating chracteristics. Typically the slope of these walls will be between about 80 and 87°. Once the trench has been formed it is overfilled with a suitable filler material 4. Typically, the thickness of layer 4 will be between about 0.7 and 1.2 microns. The removal rate during CMP of layer 21 is between about 1.3 and 5 times greater than the removal rate of layer 4.

CMP is now used to remove excess filler material from above the trench. As CMP proceeds, the polisher initially encounters only material of layer 4. After time, intermediate (transition) layer 21 is reached. Polishing of layer 21 then proceeds at a slightly faster rate than for 4, causing the surface over trench 5 to be slightly convex.

The result of using the method of the present invention is illustrated in FIG. 4. A plug of material 41 fills the original trench, protruding very slightly above the surface of 3. The removal rate of layer 21 is slightly faster than that of layer 4 and the removal rate of layer 21 is much faster than that of layer 3.

The termination of CMP at just the right time (namely when all of layer 21 has been removed and removal of layer 3 is just starting) is now relatively easy to accomplish because of the substantial difference in removal rates between layers 21 and 3. Given such a marked difference, several end-point detection schemes will now operate effectively. Examples of these include monitoring the current drawn by the polishing motor and monitoring the temperature of the polishing pad. Both these quantities will rise when a slower rate of removal, implying more friction between the wafer and the pad, is encountered.

While the invention has been particularly shown and described with reference to the preferred embodiments thereof, it will be understood by those skilled in the art that various changes in form and details may be made without departing from the spirit and scope of the invention.

What is claimed is:

1. A method for dishing avoidance, during chemical mechanical polishing, at a boundary between two materials that have different removal rates, comprising:

providing a substrate that is partly coated by a first layer having a first removal rate;

selectively depositing a second layer, having a second removal rate that is greater than said first removal rate, so as to coat only said first layer;

depositing a third layer, having a third removal rate that is less than said second removal rate and greater than said first removal rate, over both the substrate and the second layer, thereby forming the boundary between the first and third layers;

providing means for detecting changes in removal rate; and then removing material by chemical mechanical polishing until said means detect that removal of the first layer has started.

2. The method of claim 1 wherein the first layer is selected from the group consisting of silicon nitride and boron nitride.

3. The method of claim 1 wherein the second layer is selected from the group consisting of polysilicon, phosphosilicate glass, and borophosphosilicate glass.

4. The method of claim 1 wherein the third layer is silicon oxide.

5. The method of claim 1 wherein the removal rate of the second layer relative to the first layer is between about 30 and 100 times greater.

6. The method of claim 1 wherein the removal rate of the second layer relative to the third layer is between about 1.3 and 5 times greater.

7. A process for filling a trench during manufacture of an integrated circuit, comprising:

providing a silicon substrate;

providing means for detecting changes in removal rate of material during CMP;

forming a layer of thermal oxide on a surface of said silicon substrate;

depositing a layer of silicon nitride on said layer of thermal oxide;

depositing a transition layer of a material having a CMP removal rate that is greater than that of silicon nitride and greater than that of CVD oxide, on said layer of silicon nitride;

forming a trench, having walls and a width, that extends through the transition layer, through the silicon nitride, through the thermal oxide and into the silicon substrate to a depth;

depositing a layer of CVD oxide, having a removal rate that is greater than that of said layer of silicon nitride, to a thickness sufficient to overfill the trench and to fully cover the transition layer; and by means of CMP, removing material until said means detect that removal of the silicon nitride layer has begun.

8. The process of claim 7 wherein said layer of silicon nitride is deposited to a thickness between about 0.1 and 0.2 microns.

9. The process of claim 7 wherein said transition layer is deposited to a thickness between about 300 and 1,500 Angstroms.

10. The process of claim 7 wherein said layer of CVD oxide is deposited to a thickness between about 0.7 and 1.2 microns.

11. The process of claim 7 wherein said trench depth is between about 0.3 and 0.5 microns.

12. The process of claim 7 wherein said trench width is between about 0.25 and 20 microns.

13. The process of claim 7 wherein said trench walls have a slope that is between about 80 and 87 degrees.

14. The process of claim 7 wherein the transition layer is selected from the group consisting of polysilicon, phosphosilicate glass, and borophosphosilicate glass.

15. The method of claim 7 wherein said means for detecting changes in removal rate further comprise monitoring the current drawn by the polishing motor or monitoring the temperature of the polishing pad.

* * * * *